United States Patent [19]

Cho et al.

[11] Patent Number: 5,559,966
[45] Date of Patent: Sep. 24, 1996

[54] METHOD AND APPARATUS FOR INTERFACING A BUS THAT OPERATES AT A PLURALITY OF OPERATING POTENTIALS

[75] Inventors: Sung S. Cho, Sunnyvale; Eugene P. Matter, Folsom, both of Calif.

[73] Assignee: Intel Corporation, Santa Clara, Calif.

[21] Appl. No.: 120,292

[22] Filed: Sep. 13, 1993

Related U.S. Application Data

[63] Continuation-in-part of Ser. No. 973,079, Nov. 6, 1992, abandoned.

[51] Int. Cl.⁶ .................... H03K 19/0175; H02J 1/04; H02J 3/18; G06F 13/00
[52] U.S. Cl. .................... 395/285; 323/222; 361/685; 326/62
[58] Field of Search .................... 361/685; 395/275; 307/475; 323/222

[56] References Cited

U.S. PATENT DOCUMENTS

| | | | |
|---|---|---|---|
| 5,304,872 | 4/1994 | Avraham et al. | 307/475 |
| 5,307,003 | 4/1994 | Fairbanks et al. | 323/222 |
| 5,341,045 | 8/1994 | Almulla | 307/475 |
| 5,379,184 | 1/1995 | Barraza et al. | 361/685 |

FOREIGN PATENT DOCUMENTS

| | | | |
|---|---|---|---|
| 61309804 | 5/1988 | Japan | G11C 11/34 |
| 63-161579 | 5/1988 | Japan | G11C 11/34 |

OTHER PUBLICATIONS

"SGS Thomson Gears to Promote the Joys of Fuzzy Logic ..." Computergram Int'l, 6 May 1993, No. 2162.
"Chips: C&T Dedicated Sub–Notebook VGA Controller ...", Edge Work Group Computing Rpt, 28 Sep. 1992, vol. 3 No. 123.
"Intel Boosts Pentium Pro to 200 MHz", Microprocessor Report 13 Nov. 1995 vol. 9, No. 15, Michael Slater.
"Power Supplies for Pentinum, Power PC and Beyond, MicroProcessors and Microsystems", Oct. 1995, vol. 19, No. 8, pp. 489–493.

Primary Examiner—Robert A. Weinhardt
Assistant Examiner—Felicia Ives
Attorney, Agent, or Firm—Blakely, Sokoloff, Taylor & Zafman

[57] ABSTRACT

A computer system having switchable 3.3 volt or 5 volt interface bus. The computer system includes a microprocessor and multiple peripheral integrated circuits. The microprocessor and other peripheral integrated circuits are coupled to the interface bus through groups of buffers on the integrated circuits. These buffers operate at the voltage level of the interface bus and include voltage translation circuitry for translating interface bus signals to voltage level at which the core logic of the microprocessor and other peripheral chips operate.

28 Claims, 4 Drawing Sheets

METHOD AND APPARATUS FOR INTERFACING A BUS THAT OPERATES AT A PLURALITY OF OPERATING POTENTIALS

This application is a continuation-in-part application of application Ser. No. 07/973,079, filed Nov. 6, 1992, now abandoned, Jul. 7, 1994, entitled "A Method And Apparatus For Interfacing A Bus That Operates At A Plurality Of Operating Potentials".

FIELD OF THE INVENTION

The present invention relates to the field of supplying power to integrated circuits; more particularly, the present invention relates to an interface for a computer system which is capable of operating at more than one power supply potential.

BACKGROUND OF THE INVENTION

Reducing power consumption is an important concern with many modern personal computers. The reduction of power consumption is particularly significant with respect to battery-powered, laptop or notebook style personal computers. Currently, one method of reducing power consumption being attempted is lowering the power supply voltage of the computer system itself. However, some problems arise when lowering the operating potential of the computer system.

One of the problems with lowering the operating potential of the computer system is that some of the peripheral devices which may be coupled to the computer system through some type of interface or bus are only operable at the original higher potential. For example, a peripheral for a 5 volt computer system may not operate correctly in a 3.3 volt computer system. However, the computer system users still desire the use of these 5 volt peripheral devices. Therefore, it is desirable to have a computer system that operates at a lower power supply potential, yet be able to utilize peripherals which are rated to operate at another power supply potential.

Computer systems operate in conjunction with numerous peripheral devices. In the prior art, these peripheral devices usually operate at the same voltage as the computer system. However, if a computer system is set to operate at one voltage and the peripherals operate at another voltage then separate voltage translation circuitry is required such that any signals transferred between the two can be compatible. The additional voltage translation circuitry required to convert signals of different operating potentials between the peripheral devices and the computer system is expensive and requires adjustments in the timing delays of the system. Thus, it is desirable to have a computer system in which peripherals can operate at one operating potential and be coupled to and operate with the remainder of the computer system without the need for separate voltage translation circuitry.

In notebook computer systems, since the primary basis is on conserving power, if the computer system can operate at a lower voltage, then the computer system would incur less power consumption. Therefore, it is desirable that in a computer system that operates at multiple operating potentials, that it operate at the lowest of these potentials as often as possible in order to conserve power. However, if the system is capable of operating at multiple power supply potentials and is coupled to an interface which only operates at one power supply potential, it is desirable to have computer systems which is capable of operating at that potential when the interface is coupled to the computer system. Therefore, it is desirable to have a computer system which operates at its lowest potential when not coupled to an interlace of another power supply potential and which operates at the potential of the interface when one such interface is coupled to the computer system.

Moreover, if an interface which is operating at one power supply potential is coupled to a computer system operating at a different power supply potential, the computer system typically must be powered down. That is, the computer system must be turned off to allow the interface to be coupled to the computer system. In order to resume the operation of the computer system, the computer system must be rebooted and must execute a power-up routine. These requirements of powering on and off the system produce timing delays in the system. Therefore, it is desirable to have a computer system which does not have to be powered down (i.e., have the power turned off) when attaching an interface which operates at a different power supply potential.

As will be shown, the present invention provides a computer system which is capable of operating with peripheral devices at another operating potential. The present invention facilitates this by providing an interface bus which is capable of switching between multiple power supply operating potentials. The present invention also provides a method and apparatus for allowing an interface to be coupled to a computer system without having to fully power down the computer system.

SUMMARY OF THE INVENTION

A computer system is described. The computer system includes a microprocessor and a memory. The computer system of the present invention also provides an interface bus for transferring data in the computer system. The interface bus is capable of operating at multiple power supply potentials. The computer system includes at least one system core logic device coupled to the interface bus. The microprocessor and core logic device are integrated circuits having buffers with on-chip voltage translators, such that the buffers can operate at the operating potential of an interface bus and can supply logic signals to the core logic of the respective integrated circuits at the rated operating potential of the core logic. The present invention also includes control means which controls the microprocessor and the system core logic device when a change occurs in the operating potential of the interface bus, such that the operating potential of the interface bus can be changed without turning off the computer system.

BRIEF DESCRIPTION OF THE DRAWINGS

The present invention will be understood more fully from the detailed description given below and from the accompanying drawings of the preferred embodiments of the invention, which, however, should not be taken to limit the invention to this specific embodiment, but are for explanation and understanding only.

DETAILED DESCRIPTION OF THE PRESENT INVENTION

A method and apparatus for a computer system with an interface bus which is switchable between multiple operating potentials is described. The following description, and numerous details are set forth, such as specific voltages, timing diagram, and transistor configurations, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention.

System Overview

The present invention is advantageously employed in a computer system design optimized for applications with low power consumption and compact size. Such applications particularly include small battery-powered personal computers of the types commonly referred to as laptops and notebooks. One preferred embodiment of such a computer system is briefly described below; however, it is to be understood that the present invention is not limited to this particular computer system design and may be incorporated into virtually any processor-based system design.

Figure 1:
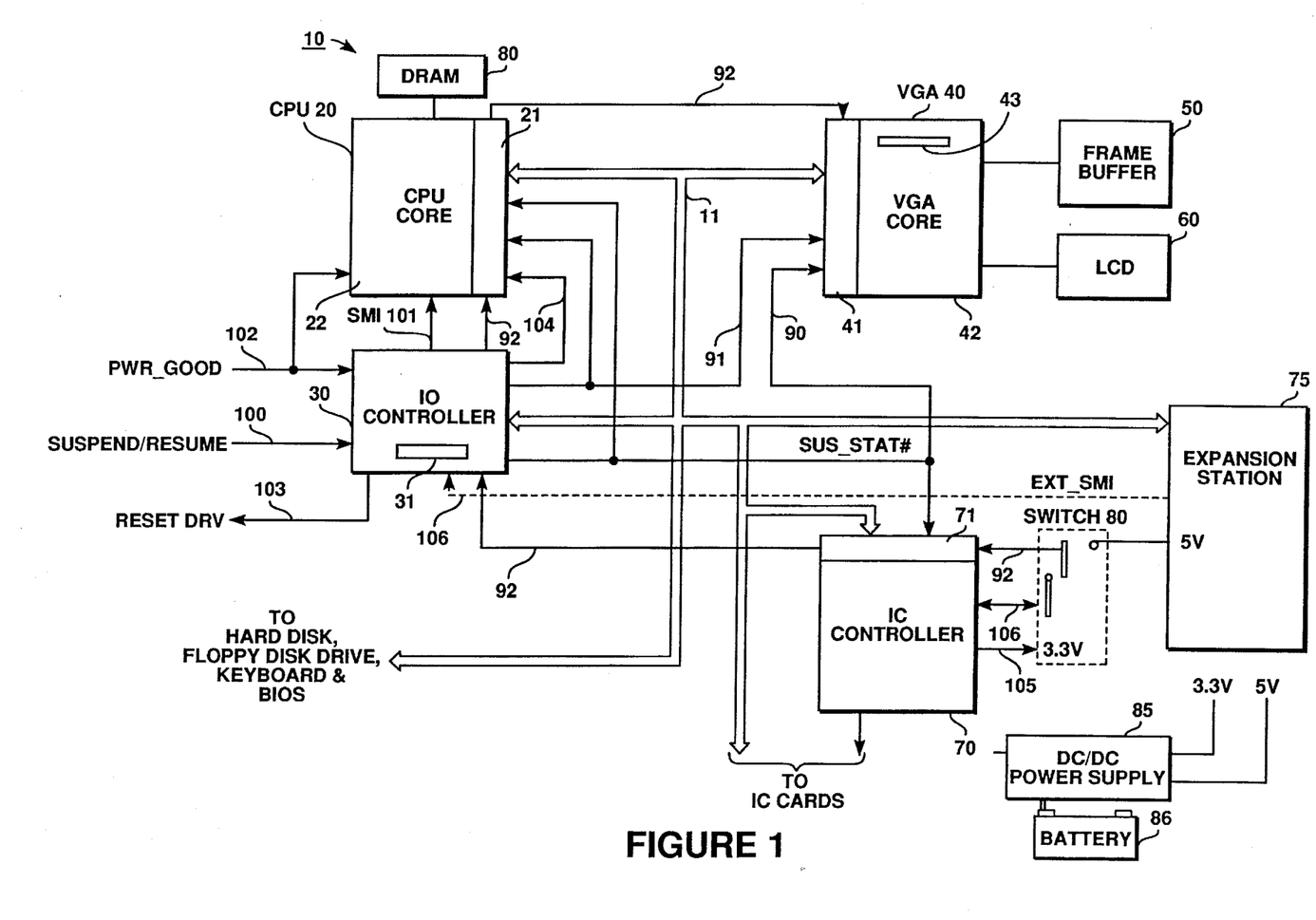
FIG. 1 is a block diagram of the computer system of the present invention.

Referring to FIG. 1, a preferred embodiment of the computer system 10 of the present invention is shown. In the preferred embodiment, computer system 10 includes a 486SL™ microprocessor manufactured by Intel Corporation, the assignee of this invention. Such a computer system is compatible with the IBM™ PCAT Personal Computer. System 10 comprises three main processor components, designated central processing unit (CPU) 20, input/output (IO) controller 30 and VGA 40 coupled to interface bus 11 which communicates information between the components on the bus 11. The combination of CPU 20 and IO controller 30 without the improvement disclosed herein are available from Intel Corporation under a product designation of 486SL™ Microprocessor SuperSet.

Referring to FIG. 1, CPU 20 is an expanded central processing unit including a core 22 comprised of a CPU, a memory controller, a cache controller and bus control logic and line buffers 21. Core 22 operates at one power supply potential. In the currently preferred embodiment, core 22 operates using a power supply rated at 3.3 volts. Buffers 21, however, are capable of operating at multiple power supply levels. In the currently preferred embodiment, buffers 21 are capable of operating using power supplies rated at 3.3 volts or 5 volts.. Buffers 21 are also capable of translating voltage signals between bus 11 and core 22. In the currently preferred embodiment, when interface bus 11 operates at 5 volts, buffers 21 are capable of translating the signals from interface bus 11 into 3.3 volt signals which are then supplied to core 22. Similarly, signals from core 22 that are supplied to interface bus 11 can be translated from 3.3 to 5 volts. The voltage level of the power supply is indicated to buffers 21 via line 92 which it is coupled to receive.

CPU 20 is also coupled to receive a PWR_GOOD signal, via line 102, which indicates when the power supply is at an acceptable operating level (i.e., functional voltage level). In the present invention, the PWR_GOOD signal is generated by a power supply. The PWR_GOOD signal causes a global reset of CPU 20 asynchronously when de-asserted (inactive). In the present invention, the PWR_GOOD signal also disables (i.e., tri-states) CPU buffers 21. A CPURESET signal (line 104), a SUS_STAT signal (line 90), a System Management Interrupt (SMI) interrupt signal (line 101) and a REFREQ signal (line 91) are also coupled to CPU 20 from IO controller 30. The CPURESET signal 104 when active causes CPU 20 to execute its reset sequence. Note also that in the present invention, CPU 20 will not exit the powered down state until both the CPURESET and the PWR_GOOD signals are both inactive, such that the power is at a functional level and the reset sequence has been executed. The SUS_STAT signal 90 indicates that computer system 10 is in a suspended state (i.e., mode). The SUS_STAT signal 90 may be used by other peripherals in the system to determine when the system is in a suspended state. The SMI interrupt 101 is a transparent system interrupt. In the currently preferred embodiment, SMI interrupt 101 is received by CPU 20 on a hardware pin designated specifically for the SMI interrupt 101. CPU 20 enters system management mode when receiving the SMI interrupt 101. In system management mode, the interrupt is handled using an interrupt routine in a manner well-known in the art. A system memory 80 is coupled to CPU 20. System memory 80 substantially comprises a Dynamic Random Access Memory (DRAM) devices.

IO controller 30 is a single chip input/output (I/O) unit comprising parallel ports, dual serial ports, real-time clock unit, dual programmable interrupt controller, power management module dual programmable timers, dual DMA controllers, memory mapper and I/O buffers. IO controller 30 also contains register 31 used to command IO controller 30 to transition to the suspend mode. A bit in register 31 is asserted by CPU 20 when suspend mode is requested. In addition, a suspend/resume signal 100 is received by IO controller 30.

In the present invention, the power suspend mode is entered in response to the SMI interrupt 101. The SMI interrupt 101 is activated by the occurrence of a hardware event. Such a hardware event may be a battery low condition, the expiration of a time-out timer, or the activation of a suspend/resume button on a computer case. For example, the action of opening or closing a lid on a computer case may activate the suspend/resume button. In response to such an event, IO controller 30 generates an SMI signal 101. SMI signal 101 allows the execution of system-wide routines that are transparent to the operating system and the application currently run on the processor. As implemented in accordance with the following description, SMI signal 101 allows software, resident in the system basic input/output system (BIOS) or in device drivers that are shipped with the system in which the microprocessor is installed, to be executed in a manner that is entirely transparent to the software application, the operating system and the operating mode of the processor (e.g., real or protected mode). This software is referred to as the SMI handler. SMI signal 101 is serviced in an operating environment that underlies the operating system and is, therefore, always accessible regardless of the operating system installed in the processor or the application that may be running when SMI 121 is invoked. An interrupt that allows execution of system-wide routines that are transparent to the operating system and the application program is described in U.S. Pat. No. 5,175,853, issued to Kardach et al. and entitled "Transparent System Interrupt", and is incorporated herein by reference. The system management mode (SMM)interrupt handler in CPU 20 handles the SMI signal 101. The SMM handler examines IO controller 30 (e.g., examining storage or other well-known circuitry) to determine the source of the SMI interrupt 101. If the source of the SMI interrupt is from some type of request to enter a suspend or power down state, the SMM handler takes the necessary steps to allow the system to be placed in that state. One method of determining the source is to check register bits stored in IO controller 30.

In the suspend mode, IO controller 30 provides two signals to computer system 10. The first signal is a SUS_STAT signal via line 90. The SUS_STAT signal indicates that computer system 10 has transitioned to a power suspend mode (i.e., that the computer system 10 is in a reduced power consumption state). In response to the SUS_STAT signal, other subsystems shut down non-vital components in order to conserve power. The second signal provided by IO controller 30 is the REFREQ signal, via line 91. This REFREQ signal is the slow clock used to refresh system memory 80 (i.e., DRAM) and video DRAM (i.e., frame buffer) 50 during suspend mode. REFREQ signal is coupled to CPU 20 and VGA 40 as shown in FIG. 1. IO controller 30 is also coupled to receive the PWR GOOD signal via line 102, which indicates when the power supply is at an acceptable level. In the currently preferred embodiment, IO controller 30 receives the PWR_GOOD signal at the same time CPU 20 receives the PWR_GOOD signal. The PWR_GOOD signal causes a global reset of IO controller 30 asynchronously. The details of the operation of these and other signals during suspend mode is described below.

In the currently preferred embodiment, IO controller 30 is capable of operating at multiple power supply levels. In the currently preferred embodiment, IO controller 30 is capable of operating at either 3 volt or 5 volt power supply levels;, including its I/O buffers. IO controller 30 is coupled to receive the power supply level via signal 92.

Integrated circuit card (IC) controller 70 is coupled to bus 11 and is responsible for controlling access by CPU 20 to changeable IC memory cards. Controller 70 also contains buffers 71 which are capable of operating at multiple power supply levels. In the currently preferred embodiment, buffers 71 operate at either 3.3 or 5 volts. The power supply level indication signal 92 is coupled to controller 70 from switch 80.

VGA 40 is a single chip graphics interface comprising VGA core 42 and buffers 41. VGA core 42 includes a VGA graphics controller and a video memory controller. VGA core 42 operates at one power supply level. In the currently preferred embodiment, VGA core 42 operates at a power supply rated at 3.3 volts. VGA buffers 41 operate at multiple power supply levels. In the currently preferred embodiment, VGA buffers 41 operate using power supplies of either 3.3 or 5 volts. The power supply level is indicated to VGA buffers 41 through a pin via signal, coupled from switch 80.

A flat panel display unit 60 is also coupled to VGA 40. An oscillator (not shown) for refreshing video frame buffer (i.e., video memory) DRAM 50 is also coupled to the VGA 40. The frame buffer 50 substantially comprises DRAM devices. The REFREQ signal (line 91) and the SUS_STAT signal (line 90) are also received by VGA 40.

VGA 40 also contains register 43 which is used to command VGA 40 to transition to the suspend or resume mode. A bit in this register is asserted by CPU 20 when suspend mode is requested. In the preferred embodiment, register 31 in IO controller 30 and register 43 in VGA 40 actually contain the exact same contents. In an alternate embodiment, there may be two separate registers, one in IO controller 30 and another in VGA 40. In either case, however, the two control bits in each register are distinct and separate control bits. IO controller 30 is able to sense when the register bit transitions to an active or inactive state. VGA 40 is able to sense when its register bit transitions to an active or inactive state.

All the subsystems are coupled to and communicate with one another and with other system components (such as expansion slots keyboard controller, disc controller, etc.) via interface bus 11. In the preferred embodiment, bus 11 is an AT compatible bus. Also coupled to bus 11 in the currently preferred embodiment of the computer system of the present invention are a hard disk, floppy disk drive, keyboard and basic input/output system (BIOS) controller, all of which are not shown to avoid obscuring the present invention.

In the present invention, interface bus 11 is capable of operating at multiple supply voltages. In the currently preferred embodiment, interface bus 11 operates at either 3.3 volts or 5 volts. In the present invention, the operating potential of computer system 10 and interface bus 11 is capable of changing when expansion station 75 is coupled to interface bus 11.

Expansion station 75 is an interface for peripherals to computer system 10. Expansion station 75 is capable of interfacing peripherals which operate at a different power supply potential than computer system 10. In other words, expansion station 75 is capable of providing an interface with slots for peripherals which require power supply voltages different from that of the computer system.

Expansion station 75 operates at one supply potential. In the currently preferred embodiment, expansion station 75 operates and provides an interface for peripherals operating at 5 volts. An expansion station 75 could be used to interface peripherals which operate at the same power supply potential as the other components in the computer system.

In the currently preferred embodiment, when expansion station 75 is being engaged to the computer system, the computer system is forced into the suspend or power down mode. In the present invention, computer system logic senses the viable power from expansion station 75 and does not allow computer system 10 to resume or power up until the power from expansion station 75 reaches a functional voltage.

In the currently preferred embodiment, the power of expansion station 75 is sensed by switch 80. In the currently preferred embodiment, switch 80 senses the 5 volt power supply voltage and prevents the computer system from resuming or powering up until the 5 volt power reaches at least 4.5 volts.

Computer system 10 is supplied by power from power supply 85. Power supply 85 supplies both 5 volts and 3.3 volts in the currently preferred embodiment. In the currently preferred embodiment, power supply 85 obtains its power from battery 86.

Suspend/Resume

In the preferred embodiment, one function implemented by the present invention is a suspend/resume function. The suspend/resume function comprises the process which internally or externally indicates to computer system 10 that it will be inactive for some period of time. For example, such an event may comprise an operator's action of closing the computer case or lid or it may comprise expiration of event timer. In the present invention, one event is the coupling of expansion station 75. In response to the detected event, the computer system selectively powers down to a low power consumption mode (i.e., power suspend mode). In response to a second event, such as an operator's opening of a computer case or lid, the computer system is automatically restored to the application programming running at the time that the first event was detected. In the case of a suspend due to coupling of expansion station 75, the computer system is automatically resumed (i.e., restored).

By allowing expansion station 75 to complete the coupling process in the suspend mode, the computer system is saved the time of being completely rebooted. The process of bringing up or shutting down an operating system is often lengthy. The present invention allows expansion station 75 to be added to the computer system without shutting down the operating system. Likewise, expansion station 75 can be added to the computer system without having to go through the complete power-on initialization process of the operating system.

In the currently preferred embodiment, computer system 10 is in the power suspend state as long as the PWR_GOOD signal is de-asserted. In the present invention, the PWR_GOOD signal goes active after a minimum time delay once the power reaches a functional level. In the currently preferred embodiment, the PWR_GOOD signal goes active after a minimum of 50 ms delay from when power reaches to 4.7 volts. When the PWR_GOOD signal goes active, computer system 10 will start to re-boot. Computer system 10 may be disengaged from expansion station 75 at any time. However, switch 80 (i.e., the system power control logic) must de-assert the PWR_GOOD signal and assert the CPURESET signal, via line 104. In one embodiment, switch 80 asserts and deasserts the PWR_GOOD and CPURESET signals using IC controller 70 through signal 106.

A hardware indication may be used to signal the termination of suspend mode and the resumption of normal operations. Such a signal may be denoted as a RESUME signal. A RESUME signal may be provided to the IO subsystem in the same manner the SUS_STAT signal is provided to CPU 20 and VGA 40, as described below. In the currently preferred embodiment, a SUSPEND/RESUME signal 100 is coupled to IO controller 30. A transition on the SUSPEND/RESUME signal 100 may also be used to indicate either suspend request or a resume request.

Switching the Operating Potential of the Interface Bus

The computer system of the present invention is capable of switching the power supply level of the interface bus 11 without powering down the computer system. When the expansion expansion 75 is coupled to the computer system, the present invention allows a computer system to enter the suspend mode. Once in the suspend mode, interface bus 11 receives power at the voltage level of the expansion station 75 (e.g., 5 volts). While in suspend mode, the buffers of CPU 20, VGA 40, I/O controller 30, and IC controller 70 are isolated. Upon exiting from the suspend mode, the buffers are set to operate at the power supply potential of expansion station 75 and interface bus 11. In the currently preferred embodiment, when expansion station 75 operates at 5 volts, then the buffers operate at 5 volts. In the currently preferred embodiment, when an expansion station is not coupled to interface bus 11, interface bus 11 operates at 3.3 volts. In this case, the buffers of CPU 20, VGA 40, IO controller 30, and PCIC 70 operate with a 3.3 volt power supply.

In the currently preferred embodiment, when the computer system is operating at 3.3 volts, the following events occur causing interface bus 11 to switch operating potentials. First, expansion station 75 is coupled to interface bus 11. When expansion station 75 is coupled, a suspend request is generated to the power management system within IO controller 30. This suspend request can be an external (EXT) SMI, as shown via dotted line 106, or could even be the signaling of the suspend/resume button. In another embodiment, a configuration register or buffer on the system switch logic could cause the generation of the EXT SMI interrupt. The power management subsystem in IO controller 30 then generates a suspend request system management interrupt (SMI) to CPU 20 via line 101. In response to the SMI interrupt, the system management mode (SMM) handler in CPU 20 identifies its source (i.e., the expansion station 75). Upon identifying that the source of the SMI interrupt is the expansion station 75, CPU 20 saves the state of all system devices which are being powered down. Furthermore, the SMM handler of CPU 20 shuts the power off to all bus subsystem peripherals. In the currently preferred embodiment, bits in a configuration register accomplishes the shutting-off of power. The SMM handler also programs each of the DRAM banks in system memory 80 to select a refresh mode. Finally, the SMM handler sets the suspend refresh bits high in CPU 20 and IO controller 30 to facilitate the refreshing of the system memory DRAM devices.

The setting of the SUS_STAT bit causes CPU 20 to start to perform suspend refresh to the memory subsystem. Also, setting the SUS_STAT bit causes the IO controller 30 to float its pins for the suspend condition. IO controller 30 also drives the SUS_STAT signal active. In the currently preferred embodiment, SUS_STAT is active low. Driving the SUS_STAT signal active activates an electronic switch (not shown) that removes 3.3 volt power source from most system logic devices, such as oscillator floppy disk controller, keyboard controller, etc. CPU 20 and IO controller 30 are still powered by the 3.3 volt power supply. In another embodiment, CPU 20 and IO controller 30 have their power removed. The SUS_STAT signal being active also causes CPU 20 to drive all of its pins to a predetermined logic state or a known logic state for the duration of the suspend condition. In the currently preferred embodiment, the SUS_STAT is also received by IC controller 70 which, in response to SUS_STAT signal being active, activates switch 80. The SUS_STAT signal being active with some delay turns on switch 80 to connect expansion power to the system and powers 5 volt peripherals and the buffers, such as buffers 21, 41, 71 and those of IO controller 30. In the currently preferred embodiment, the PWR_GOOD signal is kept high during the suspended state. In the currently preferred embodiment, the PWR_GOOD signal remains active causing data in CPU 20 and IO controller 30 to remain unchanged, as PWR_GOOD inactive resets all the data in the system. Computer system 10 is now in a suspended state.

After computer system 10 has entered the suspend mode, switch 80 senses the power supply potential of expansion station 75 to determine its level. Switch 80 indicates the power supply level to the different buffer groups coupled to bus 11 via line 92. It should be noted that power supply level detection circuitry could also be used to determine the power supply level. The power supply detection circuitry would compare the power supply level of the expansion station 75 to a predetermined or known power supply level, such as that which powers the core of CPU 20. If the two power supply levels are the same (e.g., a 3.3 volt and a 5 volt power supply level), signal 92 generated by the voltage detection circuitry would be used to indicate the result of the comparison, which could be used to apply the proper power source to the buffers. An example of such power supply level detection circuitry is disclosed in U.S. Pat. No. 5,343,086, issued Aug. 30, 1994, entitled "Automatic Voltage Detector Control Circuitry", assigned to the assignee of the present invention.

Upon sensing the power of expansion station 75, if switch 80 determines that expansion station 75 is powered by a 5 volt power supply, power supply 85 supplies both the 3.3 volt and 5 volt power supplies to the requisite parts of the system. If the computer system is a closed system, the 5 volt supply may be sourced from expansion station 75 itself.

Assuming that expansion station 75 is a 5 volt interface, once the power of interface bus 11 reaches a functional level, another external SMI signal is used to indicate to expansion station 75 that the system is ready. In one embodiment, this external SMI could be the de-activation of EXT SMI 106. Once the expansion station 75 is powered at a functional voltage level, the power management module of IO controller 30 renders the SUS_STAT signal inactive (i.e., high in the currently preferred embodiment). In the currently preferred embodiment, the second EXT SMI is not generated until the voltage reaches 4.7 volts.

The SUS_STAT signal being inactive causes the 3.3 voltage power supply to apply power to such system logic that had their power removed through electronic switches (not shown) and also indicates to CPU 20 that it should prepare to resume. In another embodiment, the SUS_STAT signal being inactive causes power to be restored to CPU core 22 and VGA core 42 when their power has been removed.

Once a functional power supply level is reached, IO controller 30 also drives the RESETDRV signal active, causing all bus peripherals, including those on expansion station 75, to be reset. It should be noted that the RESETDRV signal is actually sent on interface bus 11. RESETDRV signal has been shown as line 103 to prevent it from being obscured with other signals sent on interface bus 11. Furthermore, the functionality and implementation of a reset signal, such as RESETDRV, is well-known in the art.

Shortly after driving the SUS_STAT signal inactive, IO controller 30 places all of its signal in the normal configuration. After the oscillators reach a stable frequency, IO controller 30 drives the CPURESET signal active for a predetermined period of time. In the currently preferred embodiment, the oscillators reach a stable frequency approximately 125 ms after the SUS_STAT signal transitions to the inactive state. Also in the currently preferred embodiment, the CPURESET signal is active for 90 ms and deactivates the RESETDRV signal after this period has expired. The CPURESET signal being active resets CPU 20 and the bus architecture system.

Once CPU 20 sees the CPURESET signal active, it places all of its signals in the normal configuration. CPU 20 jumps to its reset routine and starts executing its BIOS reset code. In the currently preferred embodiment, CPU 20 eventually reaches a point in the routine where it checks the SUS_STAT bit in register 31 in the IO controller 30. This SUS_STAT bit indicates to CPU 20 that it is not in a normal power-on reset, but a resume reset. In response, the CPU 20 restores the power and reinitializes all devices that had their power removed. CPU 20 then enters into the system management mode and returns back to the interrupted application.

Similarly, when the interface bus is operating with a 5 V power supply, the same steps occur when changing the level of the power supply to 3.3 volts (e.g., due to disconnecting of the expansion station 75).

When entering and exiting the suspend mode, each of the buffer groups (e.g., buffers 21, 41, 71, etc.) are disabled. In the currently preferred embodiment, the buffers are disabled using the SUS_STAT signal. In an alternate embodiment, the PWR_GOOD signal could be used to disable the buffers from complete power down. Upon disabling the buffers, it is possible to set the output of the buffers to a predetermined logic state. The output of the buffers could be set to either a logical 1 (high) or a logical 0 (i.e., low). In another embodiment, the output of the buffers could be set to their last logic state (i.e., the buffers could return to their last known states). To retain the last logic state, circuitry which is well-known in the art is utilized.

When the power is at a functional operating potential, the trip-points of the buffers are also set according to the power supply level. In the currently preferred embodiment, the buffer trip-points are set, such that the buffers trip properly for signal levels generated at a 3.3 volt power supply level when such a supply is powering interface bus 11 and trip properly for signal levels generated at a 5 volt power supply level when such a supply is powering interface bus 11. It should be noted that two sets of buffers could be used. For example, one set of buffers would be powered by 3.3 volts and have their trip-points set for 3.3 power supply operation. Another set of buffers would be used for the 5 volt supply with trip-points set for a five volt power supply level. Each buffer group would be enabled depending on the power supply level, which could be determined by power supply detection circuitry discussed above. However, this approach would require a large amount of space on the chip and, thus, is not preferred.

Figure 2:
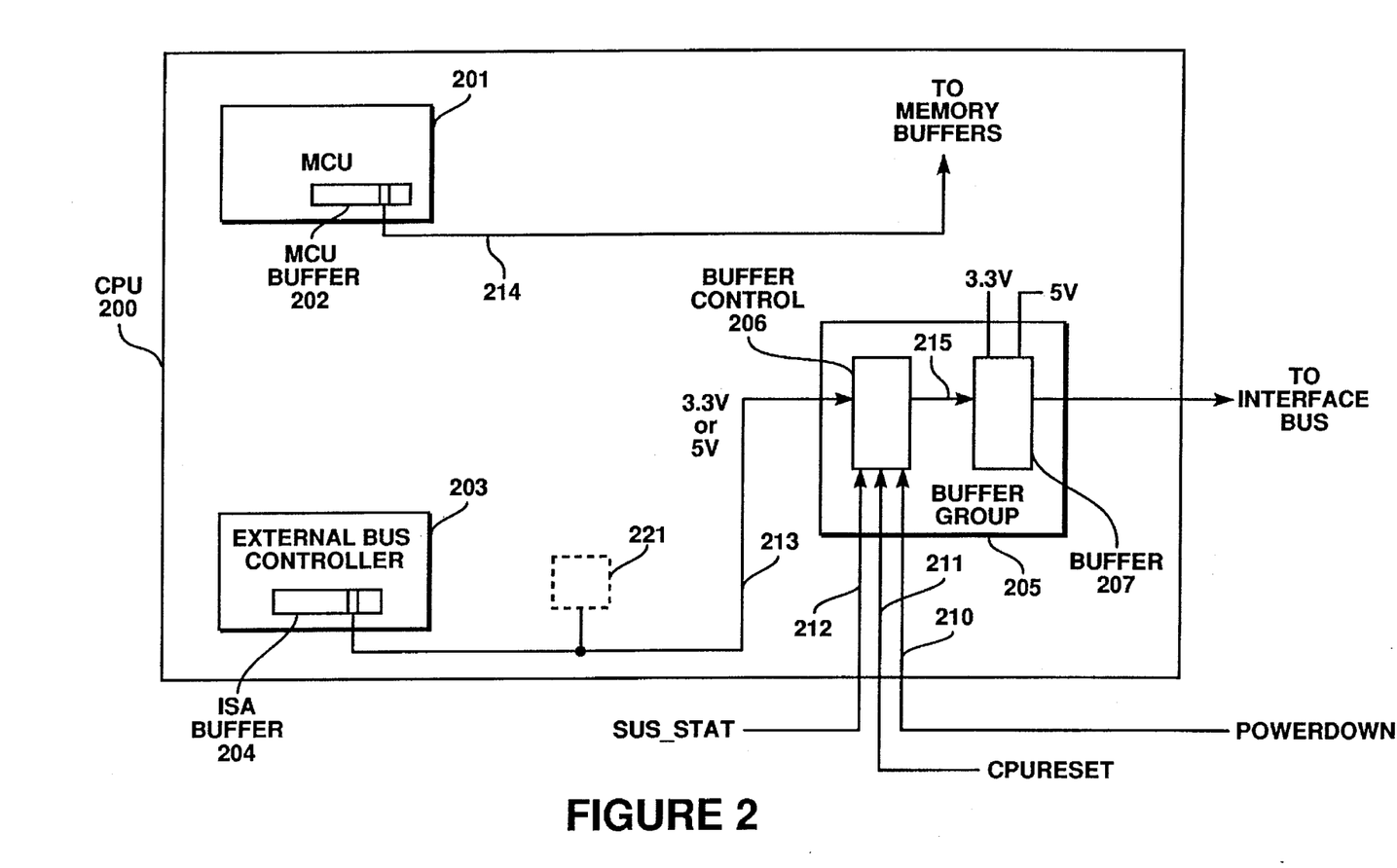
FIG. 2 is a simplified block view of the microprocessor of the present invention.

FIG. 2 depicts a simplified block diagram of the CPU for the present invention. Portions of CPU 200 have been omitted to avoid obscuring the present invention. It should be noted that although FIG. 2 represents the CPU of the computer system, it can be applied equally to the other portions of the computer system which are attached to the interface bus.

Referring to FIG. 2, the memory controller unit (MCU) 201, the external bus controller (EBC) 203 and a buffer group 205 are shown. MCU 201 controls the accesses to the memory and EBC 203 controls access to the interface bus. MCU 201 and EBC 203 operate in a manner well-known in the art.

In one embodiment, each of MCU 201 and EBC 203 contain a storage area (e.g., a register) which indicates the power supply voltage level which powers the operations of the buffers in the memory buffers and the buffers which are coupled to the interface bus. In FIG. 2, these are designated MCU buffer register 202 and ISA buffer register 204. In the currently preferred embodiment, the power supply level for the memory buffers is indicated by a register bit in MCU buffer 202 via line 214. In one embodiment, the power supply level of the interface (i.e., I/O) bus buffers is indicated by a register bit in ISA buffer 204 via line 21 3. In the currently preferred embodiment, automatic power supply detection circuitry 221 (shown in dotted box) indicates the power supply level to the ISA buffer group 205, instead of ISA buffer 204. The automatic detection circuitry 221 senses the power supply level of interface bus 11 and compares it to as predetermined power supply level. The comparison could be accomplished using a differential amplifier. In the currently preferred embodiment, the predetermined power supply level is the level of the core which operates using a power supply rated at one level. In the currently preferred embodiment, if the power supply level is the same as the core, then the power supply level of the interface bus 11 is 3.3 volts. If the two are different, then the power supply level of interface bus 11 is 5 volts. An example of the automatic power supply detection circuitry is described in U.S. Pat. No. 5,343,086, issued Aug. 30, 1994, entitled "Automatic Voltage Detector Control Circuitry", assigned to the assignee of this application and incorporated herein by reference.

The indication of the power supply level allows the buffers to adjust for differences in trip points for the separate voltage levels. An example of such a buffer is shown in U.S. Pat. No. 5,341,045, issued Aug. 23, 1994, entitled "Programmable Input Buffer", assigned to the assignee of the present invention and incorporated herein by reference. When registers are used, the register bit in ISA buffer 204 indicates whether the signals are 3.3 volt or 5 volt signals, as does the automatic power detection circuitry. It should be noted that the bits in buffers 202 and 204 could be set by the SMM handler in response to a SMI interrupt.

The ISA register 204 and MCU register 202 are programmable and determine the internal logic voltage trip points, including the trip point corresponding to the voltage input low and the voltage input high, for each of the power supply levels. In the currently preferred embodiment, the 3.3 volt or 5 volt signal from the buffers or automatic detection circuitry indicates the trip points for either the 3.3 volt or 5 volt logic devices. In the currently preferred embodiment, the programmable trip points may be set to match either TTL or CMOS logic levels. Thus, these logic levels are programmable through software (e.g., the SMM handler programming bit) or hardware (e.g., automatic detection circuitry). The trip points can be selected during power on or during suspend without affecting the system integrity during normal operation.

Buffer control 206 receives the 3.3 V/5 V indication signal via line 213 along with the SUS_STAT, CPURESET and PWR_GOOD signals. In other embodiments, the buffer control need only receive the SUS_STAT signal or the PWR_GOOD signal. In response to these signals, buffer control 206 generates the control for buffers 207 via lines 215. In the currently preferred embodiment, buffers 207 also receive their power from an external pin. In the currently preferred embodiment, buffers 207 are powered by either a 3.3 volt or 5 volt power supply (as shown in FIG. 2).

The internal buffer control 206 is capable of disabling and isolating input buffers, disabling and holding output buffers in their previous state. Moreover, control logic 206 supports "voltage drooping" whereby the computer system can dynamically change the interface bus from a lower voltage (e.g., 3.3 volt power supply) to a higher voltage (e.g., 5 volt power supply) or from a high voltage (e.g., 5 volt power supply) to a lower voltage (e.g., 3.3 volt power supply). In other words, buffers powered by a 3.3 volt power supply can ramp to 5 volts or buffers powered at 5 volts can ramp down to 3.3 volts without generating invalid logic levels, noise or logic transitions.

Figure 3:
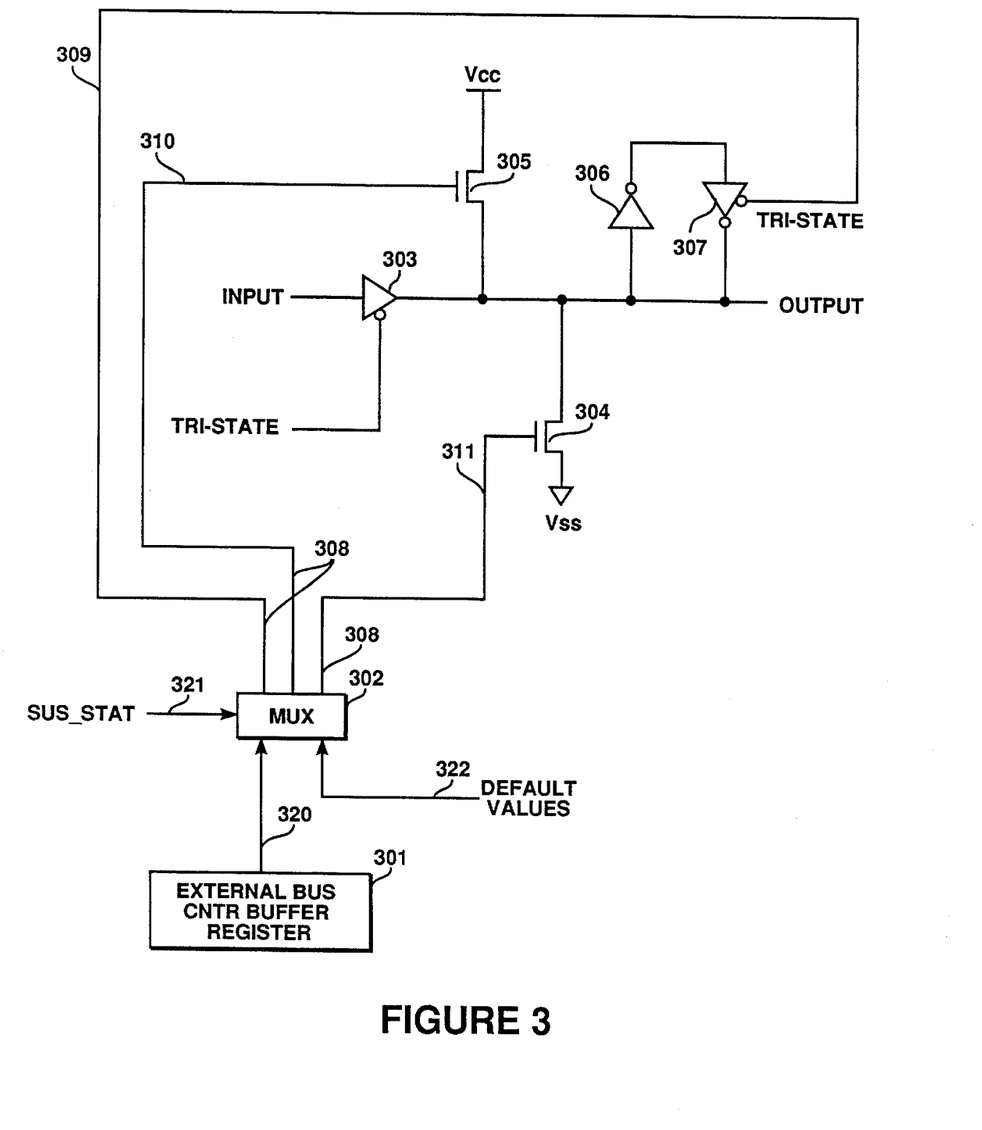
FIG. 3 is a circuit schematic of a buffer on the microprocessor of the present invention.

FIG. 3 illustrates one embodiment of the circuitry utilized to set the output of the buffers when entering the suspend mode. Referring to FIG. 3, an output buffer 303 is shown receiving an input (INPUT) and outputting an output (OUTPUT). An example of a buffer used in the present invention is shown in U.S. Pat. No. 5,341,045, issued Aug. 23, 1994 entitled "Programmable Input Buffer", assigned to the assignee of the present invention and incorporated herein by reference. Buffer 303 is coupled to and controlled by the TRI_STATE signal. In the currently preferred embodiment, the TRI_STATE signal comprises the SUS_STAT signal. When the SUS_STAT signal indicates the power is not at a nominal operating level, buffer 303 is tri-stated; otherwise buffer 303 is enabled. It should be noted thatthe PWR_GOOD signal can also be used to disable the buffers, particularly when placing the computer system in a complete power down state.

Multiplexer (MUX) 302 is coupled to receive default valves on lines 322 and configuration signals on lines 320. MUX 302 is coupled to receive the SUS_STAT signal which controls which of the inputs to MUX 302 is selected for output. In the currently preferred embodiment, when the SUS_STAT signal is active (i.e., low), MUX 302 outputs signals corresponding to lines 320. The output of MUX 302 are lines 308. In one embodiment, lines 308 comprises lines 309–311. Line 309 is coupled to the TRI_STATE input of keeper circuitry comprised of buffers 307 and 306 which retain the logic state of the OUTPUT. In one embodiment, keeper circuitry comprises buffers 306 and 307. The input of buffer 306 is coupled to the OUTPUT of buffer 303 and the output of buffer 306 is coupled to the input of buffer 307. The output of buffer 307 is coupled to OUTPUT. In the currently preferred embodiment, buffer 307 receives the signal line 309 which enables the keeper circuitry, such that the last logic state of the buffer 303 is retained by the keeper circuitry. If signal 309 tri-states buffer 307, the last logic state is not retained. Thus, signal 309 allows the output of buffer 303 to be at its last known state.

Signal 310 is used to pull the output of buffer 303 (OUTPUT) to a logical high. Signal 310 is coupled to the gate of p-channel device 305. The source of device 305 is coupled to the power supply potential ($V_{cc}$) and the drain of device 305 is coupled to the OUTPUT. In the currently preferred embodiment, device 305 is a metal oxide semiconductor (MOS) transistor. When signal 310 is low, device 305 turns on and pulls OUTPUT high. When signal 310 is high, device 305 is off and not conducting current. In this case, OUTPUT will not be pulled high.

Signal line 311 is used to pull the output to ground (i.e., $V_{ss}$). Signal 311 is coupled to the gate of n-channel device 304. The source of device 304 is coupled to ground and the drain is coupled to OUTPUT. In the currently preferred embodiment, device 304 is a MOS transistor. When signal 311 is high, device 304 turns on and pulls OUTPUT to ground. When signal 311 is low, device 304 is off and not conducting current. In this case, OUTPUT will not be pulled to ground.

Note that each of the signals 309–311 are usually activated independent of each other, such that OUTPUT will not be pulled to ground when being pulled high. Similarly, the keeper circuitry is tri-stated when pulling OUTPUT to ground. Furthermore, in other embodiments, signal 310 and signal 311 could be the same signal and depending on whether the signal is high or low, the OUTPUT would be pulled low or high respectively.

As stated above, SUS_STAT signal controls the signal outputs to the remaining circuitry. The default signal values 322 are supplied to MUX 302 from storage on chip. These default values are design choice and depend on the requirements of the remainder of the system. If the computer is in some predetermined state other than the suspended or powered down state, the computer system might require that the output of the buffers be in a predetermined state. The suspend mode signal values are generated by a buffer register 301. In the currently preferred embodiment, the buffer register 301 is located in the on-chip external bus control logic of CPU 20. To reiterate, the designation of whether the OUTPUT is pulled up, pulled down or retained at its last state is design dependent on the requirements of the computer system and system designer. If it is desired or required that the outputs be at a predetermined state, then the circuitry of FIG. 3 is capable of generating the output. Similarly, if it is desired that the last logic state be retained, then the present invention is capable of performing the function.

Figure 4:
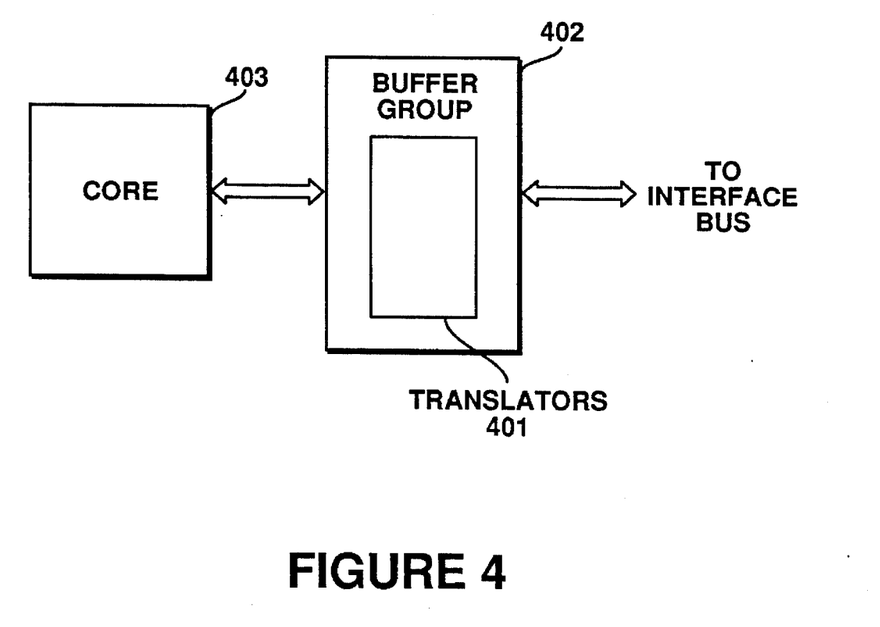
FIG. 4 is a block diagram illustrating the voltage translators used in conjunction with the buffers of the present invention.

It should be noted that in the currently preferred embodiment, similar buffer circuitry and control are found in the portions of the computer system which require buffers capable of handling 3.3 or 5 volts, such as VGA 40. Also note that the buffer groups utilize voltage translators to convert 5 volt signals to 3.3 volt signals and vice versa. When the interface bus 11 is at 5 volts, the cores of CPU 20, IO controller 30, VGA 40, etc. still operate at 3.3 volts. Therefore, signals which are transferred between the two must be translated. FIG. 4 depicts the translators 401 located in buffer group 402 transferring signals between core 403 and the interface bus. An example of a translator is disclosed in co-pending application Ser. No. 07/973,768, filed Nov. 9, 1992 entitled "Apparatus and Method for Translating Logic Signal Levels", assigned to the assignee of the present invention and incorporated herein by reference. In the currently preferred embodiment, when the bus interface 11 is powered by a 5 volt power supply, each input buffer in the buffer groups receive the signals and then a translator for each buffer translates the signals to 3.3 volt logic level signals. Similarly, when the interface bus 11 is powered by a 5 volt power supply, output buffers translate the 3.3 volt logic level signals from the core to 5 volt logic level signals to be output onto the interface bus. In the currently preferred embodiment, a translation is coupled to each buffer in the buffer group. Also when the interface bus is operating at 3.3 volts, the translators are disabled in one embodiment.

Whereas many alterations and modifications of the present invention will no doubt become apparent to a person of ordinary skill in the art. After having read the foregoing description, it is to be understood that the particular embodiment shown and described by way of illustration are no way intended to be considered limiting. Therefore, a reference to details of the preferred embodiments are not intended to limit the scope of the claims which in themselves recite only those features regarded as essential to the invention.

Thus, a method and apparatus for interfacing a bus capable of switching between multiple operating potentials is described.

We claim:

1. A computer system comprising:

a bus to transfer data wherein said bus is operable at a plurality of operating potentials and operates at one of the plurality of operating potentials at any one time;

a processor fabricated as an integrated circuit (IC) and coupled to the bus, wherein the processor comprises
a processor core to process information, and
a buffer portion having a first plurality of buffers with on-chip voltage level translators, wherein each of the first plurality of buffers is coupled to the bus to transfer data between the processor core and the bus and to perform any necessary voltage level translation when the processor core and the bus operate at different potentials;

an IC device coupled to the bus to provide at least one function, wherein the IC device comprises a device core and a second plurality of buffers with on-chip voltage translators, wherein each of the second plurality of buffers is coupled to the bus to transfer data between the device core and the bus and to perform any necessary voltage level translation when the device core and the bus operate at different potentials;

wherein the first plurality of buffers and the second plurality of buffers are operable being powered at any of said plurality of operating potentials and are powered with the same operating potential as the bus; and a control mechanism coupled to said bus, said processor and said IC device to change said one of the plurality of operating potentials of the bus without powering down the computer system.

2. The computer system as defined in claim 1 further comprising means for indicating the operating potential to the first and second plurality of buffers.

3. The computer system as defined in claim 1 wherein said control mechanism includes means for disabling the first and second plurality of buffers when changing the operating potential of the interface bus.

4. The computer system as defined in claim 3 wherein said means for disabling includes means for isolating input buffers in said first and second plurality of buffers.

5. The computer system as defined in claim 3 wherein said means for disabling includes means for holding output buffers in said first and second plurality of buffers in a previous logic state in each of said first and second plurality of buffers.

6. The computer system as defined in claim 3 wherein said means for disabling includes means for holding output buffers of each of said first and second plurality of buffers in a predetermined logic state.

7. A computer system comprising:

a bus to transfer data, wherein said bus is sends signals of a plurality of operating potentials and sends at one of the plurality of operating potentials at any one time;

a processor coupled to said bus and manipulating data, wherein said processor comprises an integrated circuit including core logic and a plurality of processor bus buffers, and further wherein said core logic operates at a first operating potential and said processor bus buffers include voltage level translators, to perform voltage translation, if necessary, on signal information being transferred, for translating signal information between said bus and said core logic at respective operating potentials of said bus means and said core logic;

a control mechanism coupled to said processor and responsive to a change in the operating potential of said bus, said control mechanism isolating the processor bus buffers in response to the change, such that the operating potential of the bus is changed without powering down the computer system.

8. The computer system defined in claim 7 wherein the processor bus buffers operate at the same operating potential as the bus.

9. The computer system as defined in claim 8 wherein said processor further comprises means for selecting the operating potential of the voltage level translators, such that the processor bus buffers operate at the same potential as the bus.

10. The computer system as defined in claim 9 wherein said means for selecting comprises a pin.

11. The computer system as defined in claim 7 further comprising at least one peripheral device having peripheral control logic and a plurality of peripheral bus buffers, and further wherein said peripheral control logic operates at a first operating potential and said plurality of peripheral bus buffers include voltage level translators that translate signal information between said first operating potential and said one of the plurality of operating potentials of said bus and said peripheral control logic, said plurality of peripheral bus buffers operating at the operating potential of the bus.

12. The computer system as defined in claim 11 further comprising means for selecting the operating potential of said voltage level translators.

13. In a computer system comprising: a bus that transfers data, said bus being operable at a plurality of operating potentials and operating at one of the plurality of operating potentials at any one time, and a microprocessor on an integrated circuit comprising a plurality of buffers having trip points coupled to said bus that provides data communications between said microprocessor and said bus, said plurality of buffers operating at said operating potential of said bus;

a core logic that processes data, said core logic coupled to said plurality of buffers, said core logic operating at a predetermined operating potential and including a means for controlling the trip point of the plurality of buffers, wherein at least one trip point of the plurality of buffers is adjusted when the operating potential of the interface bus changes, such that the microprocessor does not have to be powered down when the operating potential of the bus changes and the plurality of buffers continue buffering data between the core logic and the bus.

14. The microprocessor as defined in claim 13 wherein the trip points can be adjusted to match either transistor-transistor-logic (TTL) or complementary metal-oxide semiconductor (CMOS) logic levels.

15. The microprocessor as defined in claim 13 wherein the means for controlling the trip point comprises at least one register.

16. The microprocessor as defined in claim 15 wherein said at least one register is programmable.

17. The microprocessor as defined in claim 13 wherein the trip points of the plurality of buffers are selected during power-on or suspend mode.

18. In a computer system comprising a bus and an integrated circuit having buffers operable at a plurality of operating potentials, a method of changing an operating potential of a bus comprising the steps of:

isolating said buffers from the bus;

changing the operating potential of the bus to a new potential; and powering said buffers using the new potential.

19. In a computer system having a bus, and a plurality of devices and a CPU coupled to the bus, a method of changing an operating potential of the bus comprising the steps of:

placing the CPU and said plurality of devices in a suspended state;

dynamically changing the operating potential of said bus to a new potential without powering down the computer system; and the CPU and said devices exiting from the suspended state.

20. A method of changing an operating potential of a bus in a computer system having a CPU that includes, a plurality of buffers, and a plurality of devices coupled to the bus, comprising the steps of:

generating a suspend request;

saving states of said CPU and said plurality of devices;

entering a suspended state;

detecting a new operating potential;

isolating said plurality of buffers from the bus;

powering the bus at a new operating potential;

exiting the suspended state; and powering said plurality of buffers with said new operating potential.

21. A microprocessor, comprising:

a plurality of buffers having trip points, said buffers coupled to communicate with a circuit external to said microprocessor; and core circuitry that processes data, said core circuitry coupled to said plurality of buffers, said core circuitry operating at a predetermined operating potential and including a means for controlling said trip point of said plurality of buffers, wherein at least one trip point of said plurality of buffers is adjusted when the operating potential of said circuit external to said microprocessor changes while maintaining power when said operating potential of said circuit external to said microprocessor changes and said plurality of buffers continue buffering data between said core circuitry and said circuit external to said microprocessor.

22. The microprocessor of claim 21 wherein said trip points can be adjusted to match either transistor-transistor-logic (TTL) or complementary metal-oxide semiconductor (CMOS) logic levels.

23. The microprocessor of claim 21 wherein the means for controlling said trip point comprises at least one register.

24. The microprocessor of claim 23 wherein said at least one register is programmable.

25. The microprocessor of claim 23 wherein said trip points of said plurality of buffers are selected during power-on or suspend mode.

26. A computer system comprising:

bus means for transferring data, said bus means capable of sending signals at a plurality of operating potentials; and processor means for manipulating data and operating at a first operating potential, said processor means coupled to said bus means and having a plurality of buffers having voltage level translators that translate operating potentials of said bus means to said first operating potential.

27. The computer system of claim 7 further comprising means coupled to said processor for placing said processor in a suspend mode when said operating potential of said bus changes, wherein the operating potential of the bus is changed during the suspend mode.

28. The method of claim 18 wherein the steps of isolating and changing are performed during a suspend state.

* * * * *

UNITED STATES PATENT AND TRADEMARK OFFICE
CERTIFICATE OF CORRECTION

PATENT NO. : 5,559,966
DATED : September 24, 1996
INVENTOR(S) : Cho et al.

It is certified that error appears in the above-indentified patent and that said Letters Patent is hereby corrected as shown below:

In column 2 at line 5 delete "interlace" and insert --interface--

In column 13 at line 17 delete "07/973,768," and insert --08/973,768,--

In column 14 at line 43 insert --and-- following "logic;"

In column 16 at line 37 delete "claim 23" and insert --claim 21--

Signed and Sealed this

Fourth Day of February, 1997

Attest:

BRUCE LEHMAN

*Attesting Officer*   *Commissioner of Patents and Trademarks*